US010147785B2

(12) United States Patent
Roig-Guitart et al.

(10) Patent No.: US 10,147,785 B2
(45) Date of Patent: Dec. 4, 2018

(54) HIGH-VOLTAGE SUPERJUNCTION FIELD EFFECT TRANSISTOR

(71) Applicant: SEMICONDUCTOR COMPONENTS INDUSTRIES, LLC, Phoenix, AZ (US)

(72) Inventors: Jaume Roig-Guitart, Oudenaarde (BE); Filip Bauwens, Loppem (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/416,726

(22) Filed: Jan. 26, 2017

(65) Prior Publication Data
US 2018/0212021 A1 Jul. 26, 2018

(51) Int. Cl.
H01L 29/808 (2006.01)
H01L 29/06 (2006.01)

(52) U.S. Cl.
CPC ...... H01L 29/0634 (2013.01); H01L 29/8083 (2013.01)

(58) Field of Classification Search
CPC .......... H01L 29/0634; H01L 29/8083
See application file for complete search history.

(56) References Cited

U.S. PATENT DOCUMENTS 4,754,310 A * 6/1988 Coe ............... H01L 29/0634
257/287
8,580,651 B2 * 11/2013 Ishiguro ......... H01L 29/66712
257/E21.551
2005/0194610 A1 9/2005 Souma et al.
2007/0278592 A1 * 12/2007 Tu ............... H01L 29/0634
257/374

(Continued)

FOREIGN PATENT DOCUMENTS

EP 0372428 A1 6/1990
EP 1058318 A1 12/2000

Primary Examiner — Asok K Sarkar
Assistant Examiner — Grant Withers
(74) Attorney, Agent, or Firm — Brake Hughes Bellermann LLP

(57) ABSTRACT

In at least some embodiments, a semiconductor device structure comprises a first surface comprising a source and a gate; a second surface comprising a drain; a substrate of a first type, wherein the substrate is in contact with the drain; a first column in contact with the substrate and the first surface of the device, the first column comprising a dielectric material; and a mirroring axis, wherein a centerline of the first column is disposed along the mirroring axis, forming a first device side and a second device side, wherein the first device side mirrors the second device side. The first device side comprises a column of a second type in contact with the first column, the substrate, and the first surface of the device; a second column of the first type in contact with the substrate and the second column; a third column of the first type in contact with the substrate and the second column; a first region of the first type disposed in contact with the third column; a second region of the first type disposed in contact with the source and with a third region of the first type; and a first trench comprising the second type and a first region of the second type, wherein the first region of the second type is in contact with a gate region.

20 Claims, 7 Drawing Sheets

(56) References Cited

U.S. PATENT DOCUMENTS

| | | |
|---|---|---|
| 2011/0291112 A1 | 12/2011 | Sankin et al. |
| 2012/0019987 A1 | 1/2012 | Barreau et al. |
| 2012/0129306 A1 | 5/2012 | Hu et al. |
| 2013/0153994 A1* | 6/2013 | Lin ............... H01L 29/7813 257/330 |
| 2013/0313633 A1* | 11/2013 | Shen ............. H01L 29/66734 257/330 |
| 2014/0097517 A1 | 4/2014 | Moens et al. |
| 2015/0001624 A1 | 1/2015 | Weis |
| 2015/0295025 A1* | 10/2015 | Roig Guitart ......... H01L 29/36 257/488 |
| 2016/0087033 A1 | 3/2016 | Roig Guitart |

* cited by examiner

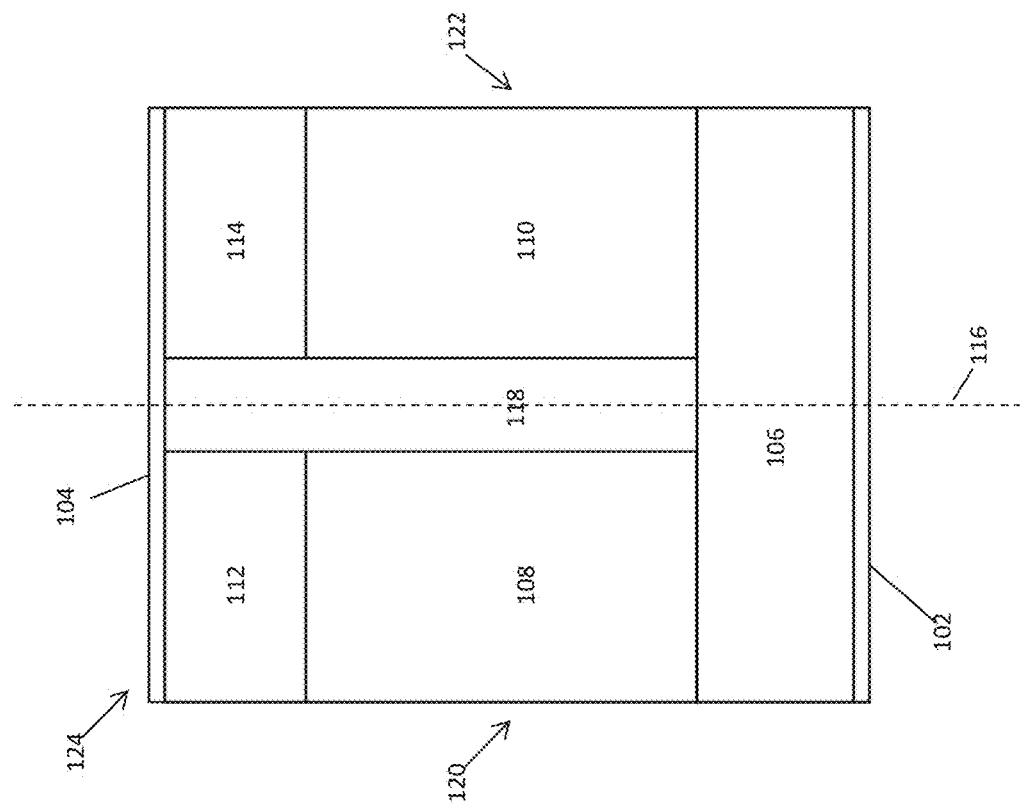

HIGH-VOLTAGE SUPERJUNCTION FIELD EFFECT TRANSISTOR

CROSS-REFERENCE TO RELATED APPLICATIONS

N/A

BACKGROUND

Emerging power applications may be based on quasi-resonant and resonant converters and use efficient, rugged and inexpensive power switches to operate at high frequencies from 500 kHz to 1 MHz. High-frequency operation requires low switching power loss and short transient times because gate charge and discharge must be included in the operation cycle. Current technologies, including global and local superjunction (SJ) power metal-oxide semiconductor field-effect transistors (MOSFETs), are limited in frequency due to their large input capacitance ($C_{iss}$) and reverse transfer capacitance ($C_{rss}$) values. Other technologies may be expensive and without avalanche capability, thus employing an additional power diode that results in increased switching power loss.

SUMMARY

In at least some embodiments, a semiconductor device structure comprises a first surface comprising a source and a gate; a second surface comprising a drain; a substrate of a first type, wherein the substrate is in contact with the drain; a first column in contact with the substrate and the first surface of the device, the first column comprising a dielectric material; and a mirroring axis, wherein a centerline of the first column is disposed along the mirroring axis, forming a first device side and a second device side, wherein the first device side mirrors the second device side. The first device side comprises a column of a second type in contact with the first column, the substrate, and the first surface of the device; a second column of the first type in contact with the substrate and the second column; a third column of the first type in contact with the substrate and the second column; a first region of the first type disposed in contact with the third column; a second region of the first type disposed in contact with the source and with a third region of the first type; and a first trench comprising the second type and a first region of the second type, wherein the first region of the second type is in contact with a gate region. One or more such embodiments may be supplemented using one or more of the following concepts, in any order and in any combination: wherein the first region of the second type is in contact with a gate region and comprises a dopant concentration higher than that of the first trench; wherein the second region of the first type comprises a higher dopant concentration than the first region of the first type, and wherein the third region of the first type comprises a lower dopant concentration than the second region of the first type; wherein the third region of the first type comprises a lower dopant concentration than the first region of the first type, and wherein the third column comprises a lower dopant concentration than the second column; further comprising an electron path that extends from the source down through the second region of the first type and down through the third region of the first type, wherein the path comprises a right angle at the interface of the first region of the first type and a right angle at the interface of the first region of the first type and the first column, wherein the electron path continues downward through the first column and then through the substrate and terminates at the drain; wherein the electron path comprises a pinch off region within the second region of the first type.

At least some embodiments include a semiconductor device structure comprising a first surface comprising a source and a gate; a second surface comprising a drain; a plurality of columns in contact with a substrate of an n-type, wherein the substrate is further in contact with the drain; a first column of the plurality of columns in contact with the substrate and the first surface of the device, the first column comprising a dielectric material; a trench comprising a dielectric material, wherein the first column is in contact with the substrate, a bottom of the trench, and a conductive material disposed in the trench; and a mirroring axis, wherein a centerline of the first column and a centerline of the trench are disposed along the mirroring axis, forming a first device side and a second device side, wherein the first device side mirrors the second device side. The first device side comprises a first n-type column in contact with the dielectric column, the substrate, and the first surface of the device; a second p-type column in contact with the substrate the first n-type column; a first region of the n-type disposed in a second region of the n-type, wherein the first n-type region comprises a dopant at a higher concentration than a dopant concentration of the second n-type region and the first n-type column comprises a dopant at a concentration greater than that of the second n-type region but less than that of the second n-type region, and wherein the first region of the n-type is in contact with a source, and wherein the second region of the n-type is in contact with the first column, the second column, and a sidewall of the trench; a first region of the p-type disposed in contact with the first n-type region and with a sidewall of the trench; and a second region of the p-type in contact with a second gate and with a third region, wherein the second and third p-type regions are in contact with the second n-type region. One or more such embodiments may be supplemented using one or more of the following concepts, in any order and in any combination: wherein the first p-type region is disposed in contact with a portion of the sidewall of the trench and a gate region; wherein the trench comprises a dielectric material in contact with the first surface of the device on each of two side walls of the trench and a bottom of the trench, wherein the dielectric material encompasses the conductive material on at least three sides; wherein the trench comprises a dielectric material in contact with the first surface of the device and at least a portion of a sidewall of the trench; wherein the dielectric material does not extend along and is not in contact with a bottom of the trench, and wherein a conductive material is disposed in the trench and is in contact with a gate and the center column and the first column; wherein the first p-type region is disposed in contact with a portion of the sidewall of the trench and with a portion of the bottom of the trench; wherein the dielectric material is not disposed at a bottom of the trench; further comprising an electron path extending from the source through the first n-type region, down through the second n-type region, and comprising a right angle at an interface of the first n-type column and the second region of the n-type such that the electron path extends through the first n-type column to the substrate and terminates at the drain; wherein the electron path comprises a pinch-off region in the second n-type region disposed between the first p-type column and the first p-type region.

At least some embodiments include a semiconductor device structure comprising a first surface comprising a source and a gate; a second surface comprising a drain; a substrate of an n-type, wherein the substrate is in contact with the drain; a first column of the plurality of columns in contact with the substrate and the first surface of the device, the first column comprising a dielectric material; and a mirroring axis, wherein a centerline of the first column is disposed along the mirroring axis, forming a first device side and a second device side, wherein the first device side mirrors the second device side. The first device side comprises a column of a p-type in contact with the first column, the substrate, and the first surface of the device; a second column of the n-type type in contact with the substrate and the second column; a third column of the n-type type in contact with the substrate and the second column and comprising a lower dopant concentration than a dopant concentration of the second column; a first region of the n-type disposed in contact with the third column; a first region of the p-type disposed in contact with the first n-type region, the second column, and the third column, wherein the first n-type region is horizontally offset from the first p-type region such that the third column is also in contact with a second region of the n-type that is in contact with a source; a trench in contact with the first surface of the device and the first p-type region. The trench comprises a dielectric material surrounding a conductive material and the trench is in contact on a first side of the trench with the third column and with the second-type region and in contact on a second side of the trench with a second region of the p-type and a third region of the p-type. One or more such embodiments may be supplemented using one or more of the following concepts, in any order and in any combination: further comprising an electron path extending from the source vertically through the second n-type region and the third column, wherein the third column comprises a pinch-off region, then horizontally through the first n-type region and vertically downward through the second column to the substrate; wherein the trench comprises two sidewalls and a bottom, wherein the two sidewalls comprise the dielectric material and the bottom comprises the conductive material and does not comprise a dielectric material; wherein the trench comprises two sidewalls and a bottom, wherein the two sidewalls and the bottom comprises a dielectric material; wherein the pinch-off region is disposed vertically between the second n-type region and the substrate and horizontally between the first side and the first p-type region.

BRIEF DESCRIPTION OF THE DRAWINGS

There are disclosed in the drawings and in the following description specific systems for the synchronization of a plurality of switching events in electrical circuits. In the drawings:

FIG. 1 is a conceptual block diagram of a cross-section of a local superjunction junction gate field effect transistor (JFET) that is cascoded with a LV Si-FET according to certain embodiments of the present disclosure.

Figure 2A:
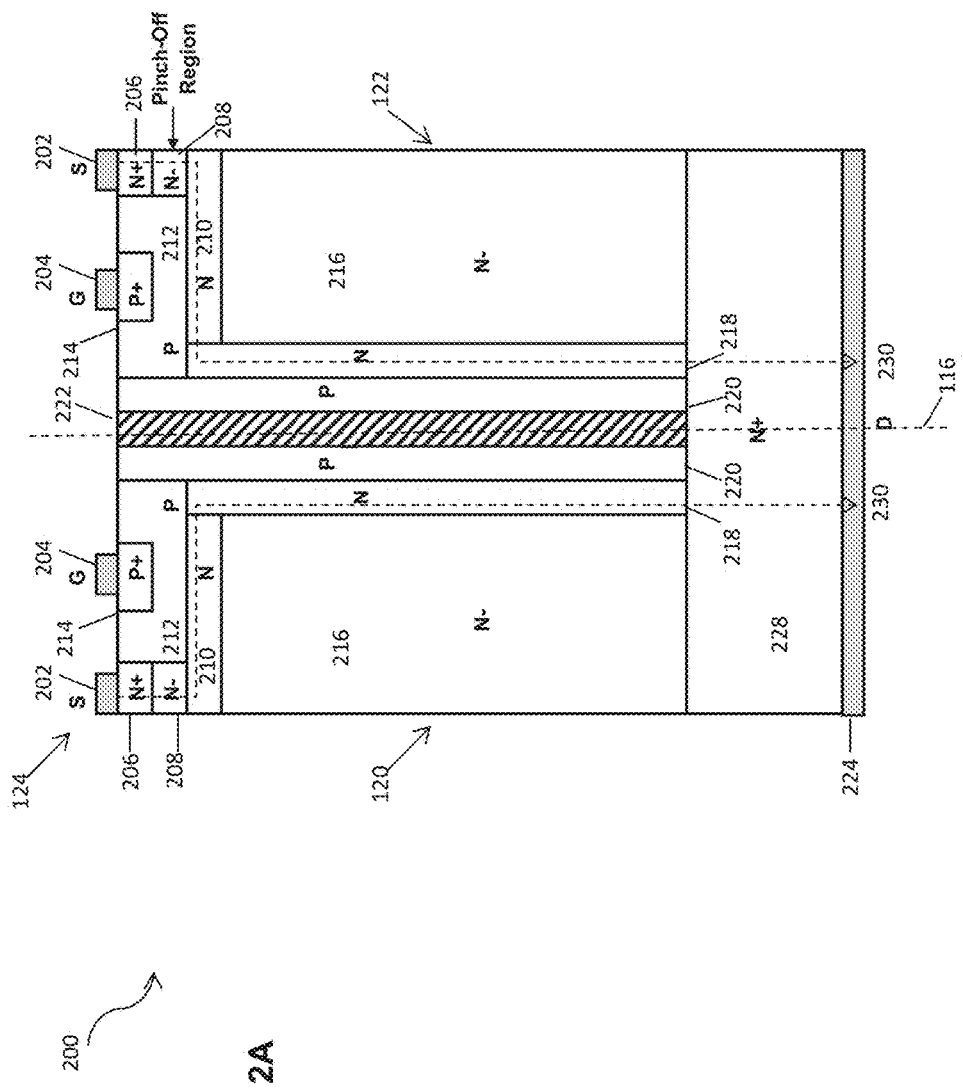
FIGS. 2A and 2B are schematic illustrations of a cross-section of a semiconductor device according to certain embodiments of the present disclosure.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are embodiments for a co-packaged cascode combining a LV Si-FET (blocking voltage (BV) ~30V) with a high voltage (HV) Si-JFET (BV~650V). The latter is a unique local SuperJunction (SJ) design, referred to herein as the "new JFET superjunction structure," where the JFET is integrated with local charge balance superjunction technology. The LV Si-FET, fabricated with one of a vertical, semi(quasi)-vertical, trench, and planar technologies, shows a substantially lower $C_{iss}$ and $C_{rss}$ than any SJ-FET technology. The designs discussed herein take advantage of the low specific on-resistance ($sR_{on}$) for high-voltage capability. Moreover, the use of a HV SJ-JFET provides avalanche capability and low cost compared to GaN-based technologies. More precisely, at least some embodiments discussed herein are directed to a cascode that may be co-packaged and which combine a low voltage (LV) Si-FET (BV~30V) with a high voltage Si-JFET. This integration provides various advantages including a lower pinch-off voltage, due in part to a low doping epitaxy, where the pinch-off voltage may be between −20V and −3V with reduced gate current leakage. In some embodiments, high doping pillars that reduce the $sR_{on}$ may be employed.

In certain embodiments, the new JFET superjunction structure may be employed with a cascode and may produce a substantial reduction of the reverse recovery charge ($Q_{rr}$), $C_{iss}$, $C_{rss}$, and gate resistance ($R_g$); allow the use of 5V drivers, provide a simplified fabrication process that may not employ a gate trench, and may have a similar output capacitance ($C_{oss}$), drain-to-source-voltage ($BV_{dss}$), and the on resistance ($R_{on}$). In various embodiments, the new JFET superjunction structure may be an HV Si JFET structure based on a local charge balance superjunction technology that is integrated in accordance with existing technology. In another embodiment of the new JFET superjunction structure, an n-link and a p-body (e.g., a p-type material) may be disposed at the bottom of a "deep" trench, i.e., a trench that is comparatively deeper than that in other embodiments or of previous works. In another embodiment, a pinch-off region may be configured to have improved control via a p+ implant at the bottom of two consecutive trenches where the pinch-off occurs between the gate trenches, or the pinch-off control may be improved by a p+ implant disposed at the bottom of two consecutive gate trenches where the p+ implant is in contact with the gate poly material or deposited metal after opening the gate oxide. In another embodiment, the new JFET superjunction structure is integrated to be compatible with existing technologies and may, in some embodiments, comprise trenches with doping gradients that increase from a top (source/gate area) to a bottom (drain area).

FIG. 1 is a conceptual block diagram of a cross-section 100 of a local superjunction JFET that is cascoded with a LV Si-FET according to certain embodiments of the present disclosure. The cross-section 100 comprises a top surface 124, a drain region 102 that may be referred to as the bottom surface 102, a first side 120 that may be referred to as a first edge 120 when in cross-section, a second side 122 that may be referred to as a first edge 122 when in cross-section, a substrate 106, a center portion 118, a central axis 116, a first lower portion 108, a second lower portion 110, a first upper portion 112, a second upper portion 114, and a region comprising a plurality of sources and gates 104. The device illustrated by the cross-section 100 may be employed in various applications, including being integrated with logic and/or other components into a semiconductor chip as a part of a power circuit or being integrated with other devices to form a discrete transistor device.

The central axis 116 is a mirroring axis such that the features defined on a first side of the central axis 116 are mirrored on the second side of the central axis 116. In an embodiment, the region 104 comprises a plurality of sources and gates—for example, there may be one source and one gate disposed on each side of the mirroring axis 116. In another example, there may be more than one source and/or gate disposed on either side of the mirroring axis. The cross-section 100 is illustrative of a larger device, and the various sources and gates in the region 104 are electrically coupled in such a device.

In an embodiment, the center portion 118 may be aligned with (e.g., bisected in one or more planes by) the central axis 116. The center portion 118 may comprise dielectric layers as well as p- and/or n-type layers that may be described as columns, since these elements extend from the substrate 106. In an embodiment, the substrate 106 may comprise a thickness (vertical measurement) between about 40 microns and about 70 microns. While the substrate 106 is illustrated as being thicker than the drain region 102 in FIG. 1, in some embodiments the drain region 102 may be thicker than the substrate 106. In an embodiment, the center portion 118 comprises a plurality of columns, some or all of which may extend from the substrate 106 to the top surface 124 of the device. In some embodiments, none of the columns extend from the substrate 106 to the top surface 124 of the device, but rather some or all of the columns may terminate at a dielectric or conductive surface that may act as the bottom of a trench.

In an embodiment, the substrate 106 may comprise an epitaxially grown silicon substrate which may be an n-type layer comprising a dopant level such that the charge balance in trench regions, also referred to as the upper portions 112 and 114, is not impacted. The first and second lower portions 108, 110 may comprise a plurality of n- and p-type regions of various dopant concentrations. As discussed herein, various depositions of n- and p-type materials may comprise gradients of dopants. That is, the concentration of a dopant in an n-type column, layer, region, or other component of the embodiments discussed herein may vary either vertically from the top surface 124 to the drain region 102, or horizontally from a first side of the device 100 to a second side of the device. Stated in another manner, the gradient of a region/column may increase or decrease in directions parallel to or perpendicular to the mirroring axis 116. The terminology used to refer to the n- and p-type layer/column dopant concentrations and relative dopant concentrations are discussed in detail in the figures below.

The lower regions 108 and 110 may be described as columns or deposits, and they may comprise a lowly-doped n-type material or a moderately doped p-type material. Doping and dopants may be discussed herein for both n- and p-type materials, wherein a "lowly" doped region is indicated by a "−" and comprises a dopant concentration of about $1.0 \times 10^{12}$ cm$^{-3}$ to about $5.0 \: 10^{14}$ cm$^{-3}$, a "highly" doped region is indicated by a "+" and comprises a dopant concentration of about $1.1 \times 10^{19}$ cm to about $5.0 \times 10^{18}$ cm$^{-3}$, and a "nominally" or "moderately" doped region comprises a dopant concentration of about $5.1 \times 10^{14}$ cm$^{-3}$ to about $1.0 \times 10^{16}$ cm$^{-3}$. The various regions discussed herein, as opposed to the columns, may be from about 0.1 microns to about 1.0 micron thick, measured vertically. In an embodiment where one or more regions comprise a dopant gradient, the dopant may be reflected as an average of the range or as the range of dopant in the gradient.

The regions including 108 and 110 may be described as superjunction structures or vertical superjunction structures, and they may have trenches, e.g., the upper regions 112 and 114 which may comprise n- and p-type regions in contact with the gate/source region 104.

FIG. 2A is a schematic illustration of a cross-section 200 of a semiconductor device according to certain embodiments of the present disclosure. The device comprises a top surface 124 that may comprise a plurality of gates 204 and sources 202, a drain 224 disposed at the bottom surface of the device, a first side 120, and a second side 122 (which may be referred to as a second edge 122 when viewed as a cross-section). FIG. 2A illustrates a semiconductor substrate 228 that may be grown epitaxially, is in contact with the drain 224, and extends from the first side 120 to the second side 122. The substrate 228 may be similar to the substrate 106 shown in FIG. 1, and the materials employed to fabricate this region may vary between embodiments. In some embodiments, the bottom surface 224 of the device and the drain 224 may be referred to interchangeably. The substrate 228 may comprise a highly-doped n-type material, indicated as "n+." A dielectric core 222 extends upward from the substrate 228 toward the top surface 124 of the device. The mirroring axis 116 from FIG. 1 is also depicted in FIG. 2, and the features, as defined on either side of the mirroring axis 116, are separate and distinct but comprise locations that are mirrored across the axis 116, and are therefore indicated with the same numbers on either side of the central axis. The dielectric core 222 is oriented such that the mirroring axis 116 passes through the center of the dielectric core 222 and such that the features described as being on the first side 120 of the axis 116 are mirrored on the second side 122 of the axis 116.

In embodiments, p-type column 220 extends from the substrate 228 to the top surface 124 of the device. The p-type column 220 is in contact with the dielectric core 222 as well as with an n-type column 218. The p-type 220 and n-type columns 218 may be described as "nominally" or "moderately" doped, in contrast to the n-type column 216, which is lowly-doped. The n-type column 216 extends from the substrate 228 towards the top surface 124, terminating before the n-type column 218 terminate at a moderately-doped p-type trench 212. A nominally doped n-type region 210 is disposed in contact with the n-type columns 216 and 218 and below a nominally doped p-type region 212. The p-type region 212 is disposed above and in contact with the nominally doped n-type region 210 and the n-type column 218 and in contact with the p-type column 220. A highly-doped p-type region 214 is in contact with a gate 204 and is disposed in the region 212, which may also be described as a trench 212. A lowly-doped n-type region 208 is disposed in contact with a portion of the region 210 and the region 212. A highly-doped n-type region 206 is disposed in contact with the regions 208 and 212, and is further in contact with a source 202 at the top surface 124 of the device. The lowly-doped n-type region 208 is also the pinch-off region 208 in this example.

While FIG. 2A illustrates certain sizes, thicknesses, widths, relative orientations and positions, and shapes of the various regions, it is appreciated that, in various embodiments, these factors may vary. In one example, the regions 206 and 208 may comprise similar thicknesses, as measured in the direction of the axis 116, while in other embodiments, the regions 206 and 208 may comprise different thicknesses. Similarly, the regions 206 and 208 may comprise similar widths, as measured in a direction perpendicular to the axis 116, while in other embodiments, the regions 206 and 208 may comprise different widths.

FIG. 2A further shows an example electron path 230, a sub-surface path internal to the device 200, which illustrates the electron flow from the source 202 vertically through the highly-doped n-type region 206 and the lowly-doped n-type region 208. The path 230 turns horizontally at approximately a right angle through the moderately doped n-type region 210. The path 230 extends through the region 210 and turns at approximately a right angle vertically downward through the moderately doped n-type region 218 and the substrate 228 before exiting at the drain 224. While the electron path 230 is shown in FIG. 2A as going through particular parts of the various regions, it is appreciated that this is for illustration purposes and that the path is created by the arrangement of doped and/or graded components and regions. In addition, while angles including right angles are discussed herein with respect to various electron paths, it is to be appreciated that these are illustrative and used to describe a sub-surface electron flow path through a plurality of components.

Figure 2B:
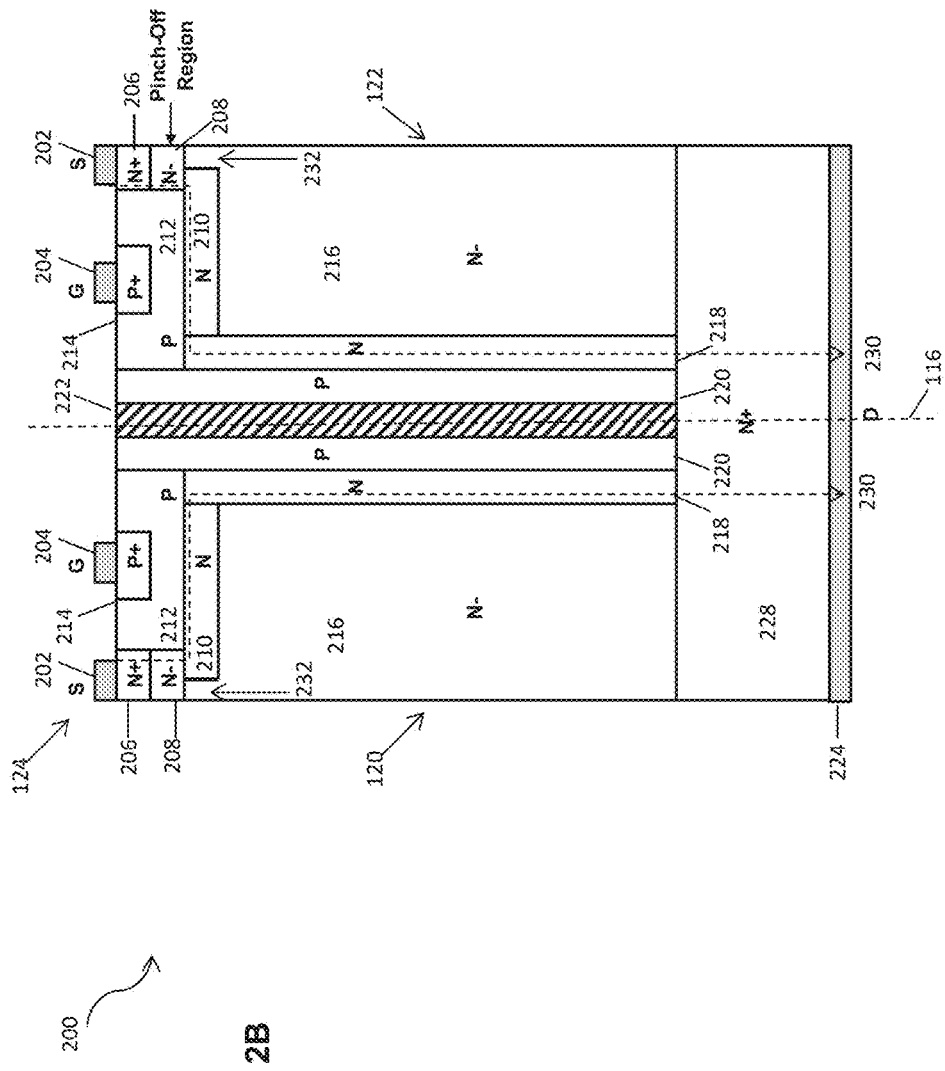

FIG. 2B shows the n-type region 210 as off-set from the side(s) 120 (122) of the device, in contrast to FIG. 2A which is configured such that the regions 206 and 208 are flush with the sides 120, 122 of the device. This offset 232 may be such that the pinch-off region includes a space (not shown) between the first side 120 of the device and the region 210, such that the pinch-off region would include a portion of the column 216. In some embodiments, the offset 232 may be such that a width (measured horizontally) of the offset 232 comprises the same width as the region 208.

Figure 3:
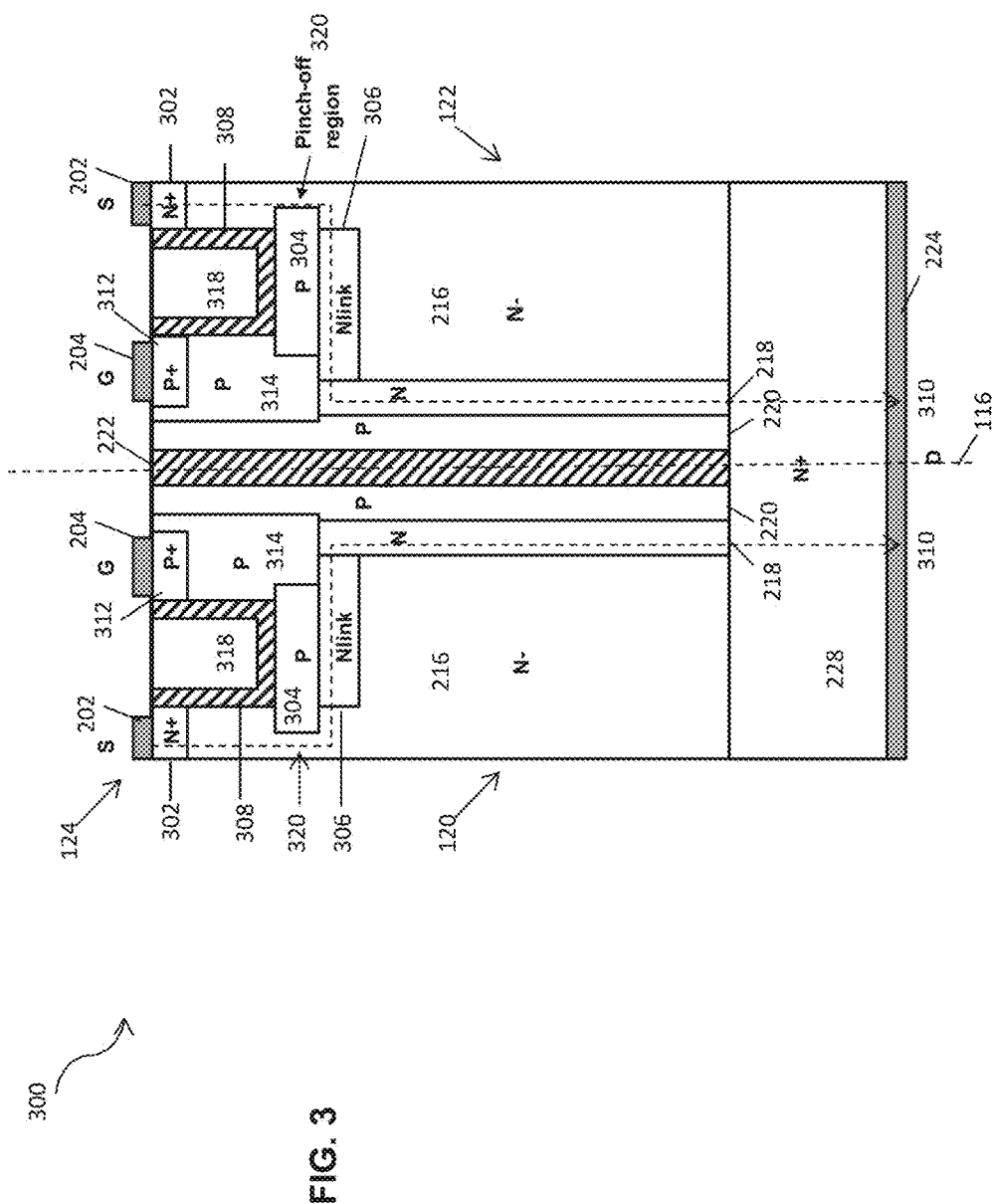
FIG. 3 is a schematic illustration of a cross-section of a semiconductor device according to certain embodiments of the present disclosure.

FIG. 3 is a schematic illustration of a cross-section 300 of a semiconductor device according to certain embodiments of the present disclosure. Similarly to FIG. 2A, the device comprises a drain 224, and a semiconductor substrate 228 grown, for example, epitaxially, and in contact with the drain 224. The substrate 228 may comprise a highly-doped n-type material, indicated as "n+." A dielectric core 222 extends upwards from the substrate 228 towards the top surface 124 of the device. The mirroring axis 116 from FIG. 1 is repeated here, and the dielectric core 222 is oriented such that the mirroring axis 116 passes through the center of the dielectric core 222. A p-type column 220 extends from the substrate 228 to the top surface 124 of the device. The p-type column 220 is in contact with the dielectric core 222. The n-type column 218 is further in contact with an n-type column 216 that extends from the substrate 228 and terminates prior to the termination of the n-type column 218. The p-type 220 and n-type columns 218 may be described as "nominally" doped, in contrast to the n-type column 216, which may be described as "lowly" doped. In an embodiment, the n-type column 216 terminates prior to the top surface 124, and comprises a height as measured from the substrate that is greater than the height of the n-type column 218.

In FIG. 3, a source 202 is in contact with a highly-doped n-type region 302 that is disposed in contact with the column 216. The region 302 is also in contact with a dielectric material that forms a trench 308 in which a conductive element 318 is disposed. The conductive element 318 may comprise a metallic material or a highly doped polysilicon. In an embodiment, a highly-doped p-type region 312 is disposed in contact with the gate 204, the dielectric trench 308, and a nominally-doped p-type region 314. The region 314 is disposed in contact with both the p-type 220 and n-type 218 columns.

A nominally-doped p-type region 304 is disposed under the trench 308 and on top of an n-link 306. The n-link acts as a conduit for electron flow, as discussed in detail below with respect to an electron path 310. The region 304 is also in contact with the lowly-doped n-type column 216, and may, depending upon the embodiment, comprise the same width as the trench 308, or it may have a smaller width, or may, as shown in FIG. 3, extend beyond the trench 308 on one or both sides of the trench 308. A pinch-off region 320 is located in between a side 120 of the device and the region 304, within the column 216.

In an embodiment, the n-link 306 may be configured such that it is in contact with the columns 218 and 216 and such that it acts as a conduit for electron flow as discussed herein. The n-link 306 may be described as a lowly-doped region, in this case an n-type region configured to provide a conduction path between primary conduction layers including at least regions 304 and 312. Similarly to FIGS. 2A-2B, the relative thicknesses and widths of the regions and columns in FIG. 3 may vary, as may the doping gradients and ranges/averages of dopants used to fabricate the various components of the cross-section 300.

FIG. 3 illustrates an exemplary electron flow path 310, which is a sub-surface path internal to the device 300. The path 310 begins at the source 202 and extends downward through the highly-doped n-type region 302 and through a portion of the column 216 including the pinch-off region 320 and the n-link 306. The electron flow path 310 continues through the n-type column 218, through the substrate 228, and terminates at the drain 224.

Figure 4:
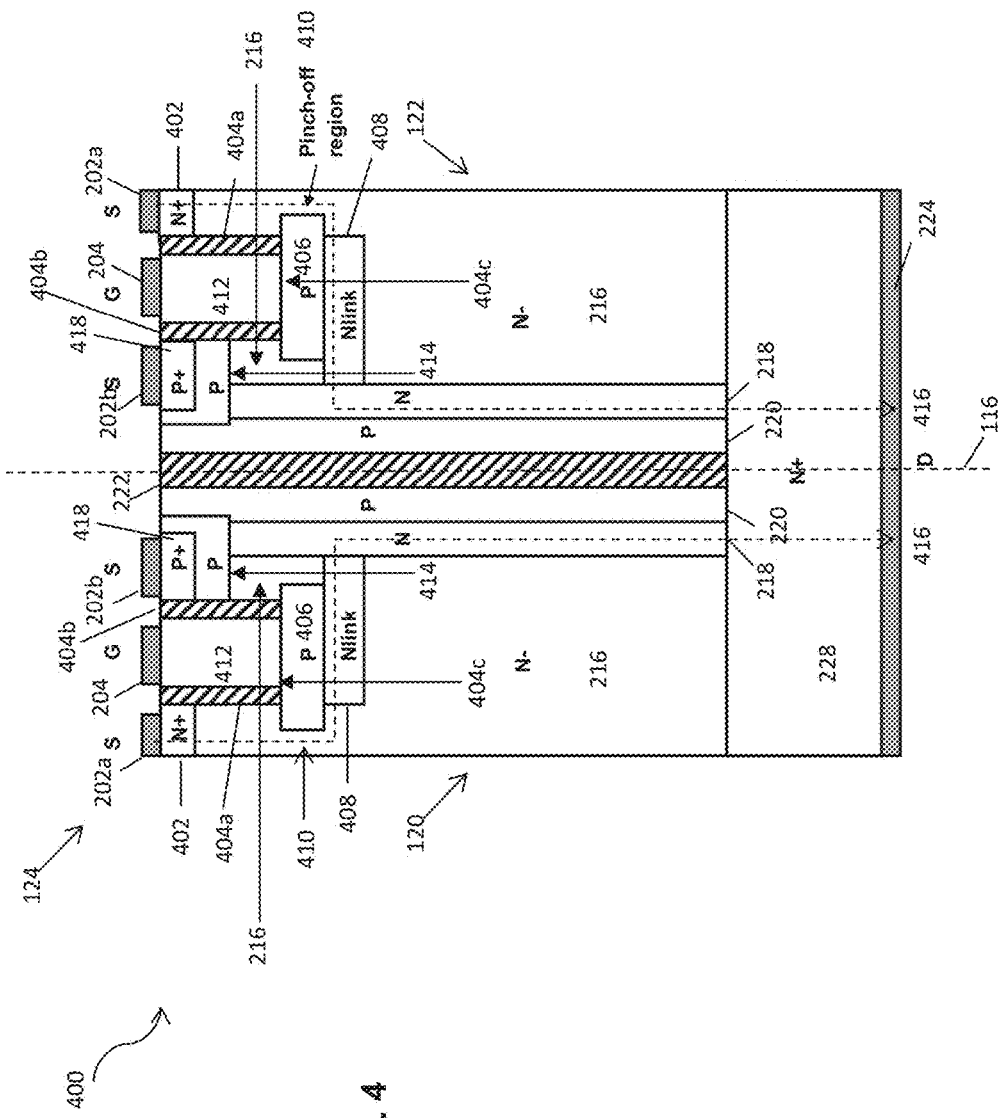
FIG. 4 is a schematic illustration of a cross-section of a semiconductor device according to certain embodiments of the present disclosure.

FIG. 4 is a schematic illustration of a cross-section 400 of a semiconductor device according to certain embodiments of the present disclosure. Similarly to FIGS. 2A-2B, the device comprises a drain 224 disposed at the bottom of the device, and a semiconductor substrate 228 grown, for example, epitaxially, and in contact with the drain 224. The substrate 228 may comprise a highly-doped n-type material, indicated as "n+." A dielectric core 222 extends upwards from the substrate 228 towards the top surface 124 of the device. The mirroring axis 116 from FIG. 1 is repeated here, and the dielectric core 222 is oriented such that the mirroring axis 116 passes through the center of the dielectric core 222. A p-type column 220 extends from the substrate 228 to the top surface 124 of the device. The p-type column 220 is in contact with the dielectric core 222 as well as with an n-type column 218. The n-type column 218 extends from the substrate 228 and terminates prior to the termination of the p-type column 220 such that the n-type column 218 comprises a height as measured from the substrate that is less than the height of the p-type column 220. The p-type and n-type columns 220, 218 may be described as "nominally" doped, in contrast to the n-type column 216 which is "lowly" doped. The column 216 extends from the substrate 228 and terminates prior to the termination of the n-type column 218 such that the n-type column 216 comprise a heights as measured from the substrate that is less than the height of the n-type column 218. It is appreciated that the column 216 is indicated in two locations on each side of the axis 116.

As shown in FIG. 4, a source 202a is disposed at the top surface 124 of the device and is in contact with a highly-doped n-type region 402. The region 402 is in contact with the column 216 and with a nominally-doped p-type region 406, as well as one of two dielectric side walls 404a and 404b disposed on either side of a conductive trench 412. The conductive trench 412 may comprise a metallic material or a highly doped polysilicon. In an embodiment, the n-type region 402 extends horizontally from the first side 120 to the sidewall 404a. In an embodiment, the dielectric material of the side walls 404a and 404b does not extend along a bottom 404c of the trench that is in contact with the p-type region 406. In this example, as shown in FIG. 4, the p-type region 406 is in contact with the conductive trench 412. While the sidewalls 404a and 404b are shown in FIG. 4 as extending from the top surface 124 to the p-type region 406, in various embodiments, the dielectric material of the sidewalls 404a and 404b may terminate prior to the p-type region 406.

The region 406 is in contact with the column 216 as well as an n-link 408 that may function similarly to the n-link 306 in FIG. 3. In an embodiment, the n-link 408 is in contact with the columns 216 and 218. A second source 202b is disposed in contact with a highly-doped p-type region 418. The region 418 is also in contact with a second dielectric wall 404b and the nominally-doped p-type region 414. In an embodiment, the p-type region 406 may be horizontally offset with the n-link 408, as shown, by more or less than the amount shown in FIG. 4, such that the n-link 408 is in contact with the n-type column 218 but not with the side 120 (or 122). A pinch-off region 410 is within the column 216 between the region 406 and the side 120.

An example electron flow path 416 is shown in FIG. 4. In an embodiment, an electron flow path 416 is established from the source 202a and extends vertically downward through the n-type region 402. The path 416 further extends downward through the n-type region 216 and through the pinch-off region 410. The path 416 then turns at about a right angle horizontally towards the axis 116 and through the n-link 408 to the interface of the n-link 408 and the column 218. The path 416 then turns at about a right angle to extend vertically through the n-type column 218 and the substrate 228, terminating in the drain region 224.

Figure 5:
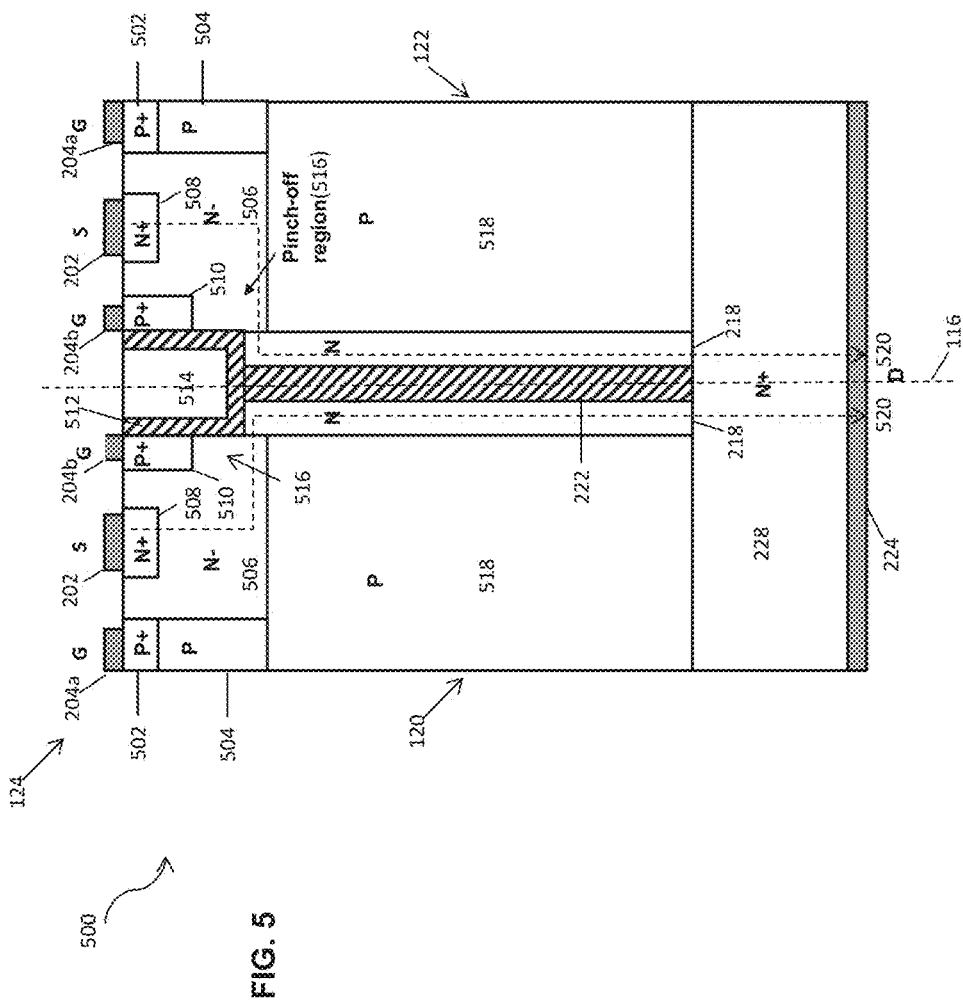
FIG. 5 is a schematic illustration of a cross-section of a semiconductor device according to certain embodiments of the present disclosure.

FIG. 5 is a schematic illustration of a cross-section 500 of a semiconductor device according to certain embodiments of the present disclosure. Similarly to FIGS. 2A-2B, the device comprises a drain 224 that may also be referred to as the bottom surface 224 of the device, a semiconductor substrate 228 grown, for example, epitaxially, and in contact with the drain 224. The substrate 228 may comprise a highly-doped n-type material, indicated as "n+." A dielectric core 222 extends from the substrate 228 up towards a conductive element 514 disposed in a trench 512 that is formed by dielectric material. The conductive element 514 may comprise a metallic material or a highly doped polysilicon. The mirroring axis 116 from FIG. 1 is repeated here, and the dielectric core 222 is oriented such that the mirroring axis 116 passes through the center of the dielectric core 222. An n-type column 218 is disposed adjacent to the core 222 and may be described as "nominally" doped. The column 218 extends from the substrate 228 up towards the trench 512 formed by dielectric material, and is in contact with the trench 512 as well as with a nominally-doped p-type column 518. The column 518 extends from the substrate 228 towards the regions 504 and 506 such that the column 518 is in contact with the regions 504 and 506. The column 518 terminates prior to the top surface 124 such that a height of the column 518 measured from the substrate 228 is less than a height of the column 218, similarly measured.

In an embodiment, two gates 204a and 204b are disposed at the top surface 124 in contact, respectively, with a first highly-doped p-type region 502 and a second highly-doped p-type region 510. The first highly-doped p-type region 502 is disposed in contact with a nominally-doped p-type region 504 that extends vertically from the column 518 to the first highly-doped p-type region 502 and horizontally from the first side 120 to the region 506. The moderately doped n-type columns 218 extend from the substrate 228 up towards a conductive element 514 disposed in a trench 512. The trench 512 is formed by dielectric material, and the columns 218 terminate at the trench 512 and are contact with the nominally-doped p-type column 518. The regions 502 and 504 are also in contact with a lowly-doped n-type region 506 which may also be described as a trench. A highly-doped n-type region 508 is partially disposed in the region 506 and is contact with a source 202 disposed at the top surface 124. In an embodiment, the second highly-doped p-type region 510 is also disposed in contact with the region 506 as well as with the dielectric trench 512. A pinch-off region 516 is located within the region 506 between the second highly-doped p-type region 510 and the column 518.

An example electron flow path 520 is also illustrated in FIG. 5. The flow path 520 starts at the source 202 and moves vertically downward through the heavily doped n-type region 508 and the lowly-doped n-type region 506. The path 520 makes a horizontal turn at about a right angle through the region 506 towards the axis 116 and through the pinch-off region 516. The path 520 then takes another turn at about a right angle vertically downward through the n-type column 218 and the substrate 228, terminating in the drain region 224.

Figure 6:
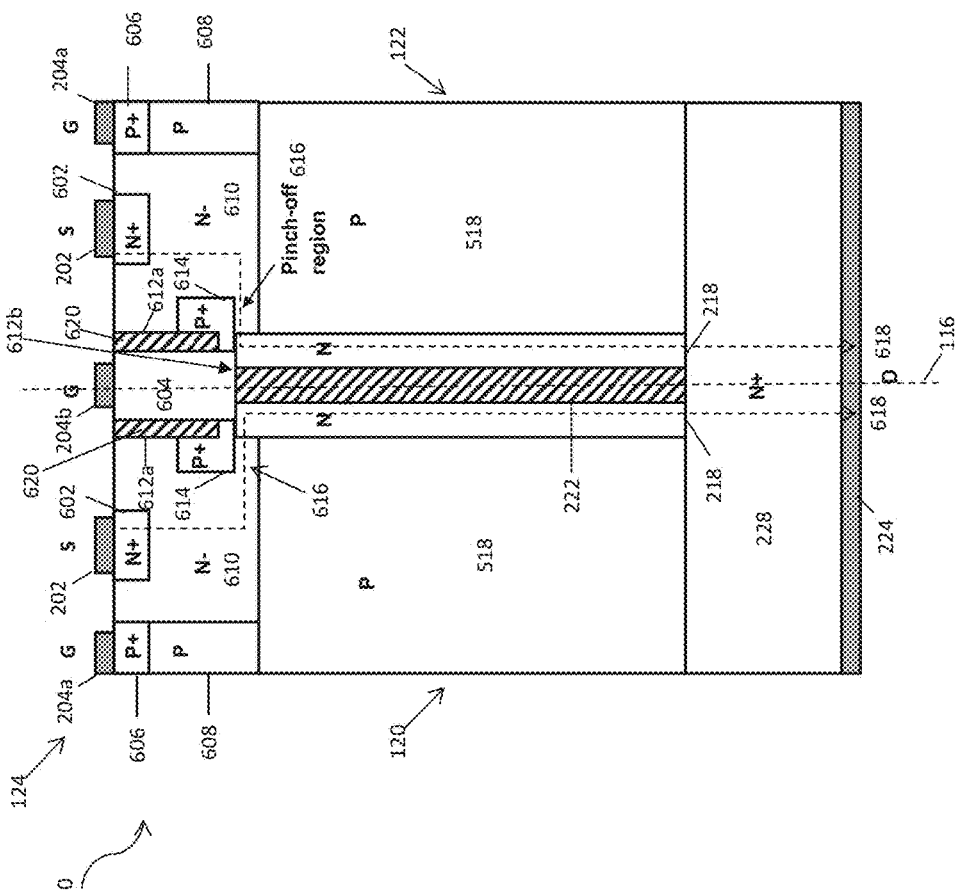
FIG. 6 is a schematic illustration of a cross-section of a semiconductor device according to certain embodiments of the present disclosure.

FIG. 6 is a schematic illustration of a cross-section 600 of a semiconductor device according to certain embodiments of the present disclosure. Similarly to FIGS. 2A-2B, the device comprises a drain 224 that may also be referred to as the bottom surface 224 of the device and a semiconductor substrate 228 that is grown, for example, epitaxially, and that is in contact with the drain 224. The substrate 228 may comprise a highly-doped n-type material, indicated as "n+." A dielectric core 222 extends upwards from the substrate 228 towards a bottom 612b of a trench 604. The conductive trench is in contact with a gate 204b at the top surface 124. The mirroring axis 116 from FIG. 1 is repeated here, and the dielectric core 222 is oriented such that the mirroring axis 116 passes through the center of the dielectric core 222. An n-type column 218 is disposed in contact with the core 222 and may be described as "nominally" doped. A nominally-doped p-type column 518 is in contact with the column 218, the substrate 228, as well as other regions. The columns 218 extend from the substrate 228 up towards the trench 604. The conductive trench 604 may comprise a metallic material or a highly doped polysilicon with dielectric material(s) 620 disposed as discussed herein. The gate 204b is aligned along the axis 116, similarly to the trench 604 and the column 222. In an embodiment, the trench 604 comprises a dielectric material 620 extending along a portion of a side wall 612a. A highly-doped p-type region 614 extends outward from each sidewall 612a horizontally and then extends vertically downward and horizontally towards the axis 116 to a bottom portion of the sidewall 612a. In an embodiment, the region 614 may be said to "wrap around" the bottom portions of the wall 612a such that the region 614 is in contact with the column 218, the region 610, the sidewall 612a, and the trench 604.

In some embodiments, the dielectric material 620 of the sidewall 612a of the trench 604 does not extend along the entire wall of the trench 604. Rather, in this example as shown in FIG. 6, the dielectric material 620 may terminate prior to a bottom 612b of the trench. Thus, in some embodiments, the bottom 612b of the trench, in contrast to FIG. 5, does not comprise a dielectric material 620. In one example, the bottom 612b of the trench 604 is in contact with the columns 222 and 218, as well as with the p-type region 614. The highly-doped p-type region 614 is thus in contact with the column 218, as well as a lowly-doped n-type region 610. A source 202 is in contact with the region 610 and a highly-doped n-type region 602, which can be said to be disposed in the region 610. A highly-doped p-type region 606 is disposed in contact with a gate 204a and with the region 608, as well as with the lowly-doped n-type region 610. The column 518 is in contact with the regions 610 and 608, and may extend from the core 518 towards each side of the device, terminating in the side(s) of the device. The column 518 terminates prior to the top surface 124 such that a height of the column 518 measured from the substrate 228 is less than a height of the column 218, similarly measured. A pinch-off region 616 may be located on the path 618 in the lowly-doped n-type region 610, in particular in between the highly-doped p-type region 614 and the column 518.

FIG. 6 illustrates an exemplary electron flow path 618 that begins at the source 202, extends vertically down through the highly-doped n-type region 602 and a portion of the region 610. The path 618 may then turn horizontally at about a right angle through the lowly-doped n-type region 610 and the pinch-off region 616 in order to reach the interface of the region 610 and the column 218. The path 618 then turns vertically downward at about a right angle through the column 218 and the substrate 228 before terminating at the drain 224.

Exemplary embodiments are disclosed and variations, combinations, and/or modifications of the embodiment(s) and/or features of the embodiment(s) made by a person having ordinary skill in the art are within the scope of the disclosure. Alternate embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Each and every claim is incorporated into the specification as further disclosure, and the claims are exemplary embodiment(s) of the present invention.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

Numerous other variations and modifications will become apparent to those skilled in the art once the above disclosure is fully appreciated. It is intended that the following claims be interpreted to embrace all such variations, modifications and equivalents.

What is claimed is:

1. A semiconductor device structure comprising:
a first surface comprising a source and a gate;
a second surface comprising a drain;
a substrate of a first material type, wherein the substrate is in contact with the drain;
a first column in contact with the substrate and the first surface of the device, the first column comprising a dielectric material; and
a mirroring axis, wherein a centerline of the first column is disposed along the mirroring axis, forming a first device side and a second device side, wherein the first device side mirrors the second device side;
wherein the first device side comprises:
a column of a second material type in contact with the first column, the substrate, and the first surface of the device;
a second column of the first material type in contact with the substrate and the column;
a third column of the first material type in contact with the substrate and the second column;
a first region of the first material type disposed in contact with the third column;
a second region of the first material type disposed in contact with the source and with a third region of the first material type; and
a first trench comprising the second material type and a first region of the second material type, wherein the first region of the second material type is in contact with a gate region.

2. The structure of claim 1, wherein the first region of the second material type is in contact with the gate region and comprises a dopant concentration higher than that of the first trench.

3. The structure of claim 1, wherein the second region of the first material type comprises a higher dopant concentration than the first region of the first material type, and wherein the third region of the first material type comprises a lower dopant concentration than the second region of the first material type.

4. The structure of claim 1, wherein the third region of the first material type comprises a lower dopant concentration than the first region of the first material type, and wherein the third column comprises a lower dopant concentration than the second column.

5. The structure of claim 1, further comprising an electron path that extends from the source down through the second region of the first material type and down through the third region of the first material type, wherein the electron path comprises a right angle at an interface of the first region of the first material type and the second region of the first material type; and a right angle at an interface of the first region of the first material type and the first column, wherein the electron path continues downward through the first column and then through the substrate and terminates at the drain.

6. The structure of claim 5, wherein the electron path comprises a pinch off region within the second region of the first material type.

7. A semiconductor device structure comprising:
a first surface comprising a source and a gate;
a second surface comprising a drain;
a plurality of columns in contact with a substrate of an n-type, wherein the substrate is further in contact with the drain;
a first column of the plurality of columns in contact with the substrate and the first surface of the device, the first column comprising a dielectric material;
a trench comprising a dielectric material, wherein the first column is in contact with the substrate, a bottom of the trench, and a conductive material disposed in the trench; and
a mirroring axis, wherein a centerline of the first column and a centerline of the trench are disposed along the mirroring axis, forming a first device side and a second device side, wherein the first device side mirrors the second device side;
wherein the first device side comprises:
a first n-type column of the plurality of columns in contact with the dielectric column and the substrate;
a second p-type column of the plurality of columns in contact with the substrate and the first n-type column;
a first region of the n-type disposed in a second region of the n-type, wherein the first n-type region comprises a dopant at a higher concentration than a dopant concentration of the second n-type region and the first n-type column comprises a dopant at a concentration greater than that of the second n-type region but less than that of the first n-type region, and wherein the first region of the n-type is in contact with a source, and wherein the second region of the n-type is in contact with the first column, the second p-type column, and a sidewall of the trench;
a first region of the p-type disposed in contact with a first gate, the second region of the n-type and with a sidewall of the trench; and
a second region of the p-type in contact with a second gate and with a third p-type region, wherein the second and third p-type regions are in contact with the second n-type region.

8. The device of claim 7, wherein the first p-type region is disposed in contact with a portion of the sidewall of the trench and a gate region.

9. The device of claim 7, wherein the trench comprises a dielectric material in contact with the first surface of the device on each of two sidewalls of the trench and the bottom of the trench, wherein the dielectric material encompasses the conductive material on at least three sides.

10. The device of claim 7, wherein the trench comprises a dielectric material in contact with the first surface of the device and at least a portion of a sidewall of the trench.

11. The device of claim 10, wherein the dielectric material does not extend along and is not in contact with the bottom of the trench, and wherein the conductive material disposed in the trench is in contact with the first column and the first surface.

12. The device of claim 11, wherein the dielectric material is not disposed at the bottom of the trench.

13. The device of claim 11, wherein the dielectric material is not disposed at the bottom of the trench.

14. The device of claim 7, further comprising an electron path extending from the source through the first n-type region, down through the second n-type region, and comprising a right angle at an interface of the first n-type column and the second region of the n-type such that the electron path extends through the first n-type column to the substrate and terminates at the drain.

15. The device of claim 14, wherein the electron path comprises a pinch-off region in the second n-type region disposed between the second p-type column and the first p-type region.

16. A semiconductor device structure comprising:
a first surface comprising a source and a gate;
a second surface comprising a drain;
a substrate of an n-type, wherein the substrate is in contact with the drain;
a first column of a plurality of columns, the first column in contact with the substrate and the first surface of the device, the first column comprising a dielectric material; and
a mirroring axis, wherein a centerline of the first column is disposed along the mirroring axis, forming a first device side and a second device side, wherein the first device side mirrors the second device side;
wherein the first device side comprises:
a column of the plurality of columns of a p-type in contact with the first column, the substrate, and the first surface of the device;
a second column of the plurality of columns of the n-type in contact with the substrate and the second column;
a third column of the plurality of columns of the n-type in contact with the substrate and the second column and comprising a lower dopant concentration than a dopant concentration of the second column;
a first region of the n-type disposed in contact with the third column;
a first region of the p-type disposed in contact with the first n-type region and the third column, wherein the first n-type region is horizontally offset from the first p-type region such that the third column is also in contact with a second region of the n-type that is in contact with a source;
a trench in contact with the first surface of the device and the first p-type region; and
wherein the trench comprises a dielectric material surrounding a conductive material and the trench is in contact on a first side of the trench with the third column and with the second n-type region and in contact on a second side of the trench with a second region of the p-type and a third region of the p-type.

17. The device of claim 16, further comprising an electron path extending from the source vertically through the second n-type region and the third column, wherein the third column comprises a pinch-off region, then horizontally through the first n-type region and vertically downward through the second column to the substrate.

18. The device of claim 17, wherein the pinch-off region is disposed vertically between the second n-type region and the substrate and horizontally between the first side and the first p-type region.

19. The device of claim 16, wherein the trench comprises two sidewalls and a bottom, wherein the two sidewalls comprise the dielectric material and the bottom comprises the conductive material and does not comprise a dielectric material.

20. The device of claim 16, wherein the trench comprises two sidewalls and a bottom, wherein the two sidewalls and the bottom comprises a dielectric material.

* * * * *

UNITED STATES PATENT AND TRADEMARK OFFICE
CERTIFICATE OF CORRECTION

PATENT NO.        : 10,147,785 B2
APPLICATION NO.   : 15/416726
DATED             : December 4, 2018
INVENTOR(S)       : Roig-Guitart et al.

Page 1 of 1

It is certified that error appears in the above-identified patent and that said Letters Patent is hereby corrected as shown below:

In the Claims

In Column 13, Claim 12, Lines 66-67, delete "claim 11, wherein the dielectric material is not disposed at the bottom of the trench." and insert -- claim 10, wherein the first p-type region is disposed in contact with a portion of the sidewall of the trench and with a portion of the bottom of the trench. --, therefor.

In Column 14, Claim 16, Line 32, delete "the second" and insert -- the --, therefor.

Signed and Sealed this
Twenty-sixth Day of February, 2019

Andrei Iancu
*Director of the United States Patent and Trademark Office*